United States Patent
Roberts

(10) Patent No.: US 11,608,135 B2
(45) Date of Patent: Mar. 21, 2023

(54) OPERATING DEVICE FOR A BICYCLE

(71) Applicant: Mahle International GmbH, Stuttgart (DE)

(72) Inventor: Thomas Roberts, Stuttgart (DE)

(73) Assignee: Mahle International GmbH

( * ) Notice: Subject to any disclaimer, the term of this patent is extended or adjusted under 35 U.S.C. 154(b) by 0 days.

(21) Appl. No.: 17/868,760

(22) Filed: Jul. 19, 2022

(65) Prior Publication Data

US 2023/0024090 A1 Jan. 26, 2023

(30) Foreign Application Priority Data

Jul. 23, 2021 (EP) ..................................... 21000199

(51) Int. Cl.
*H05K 7/00* (2006.01)
*B62J 50/21* (2020.01)
*H05K 7/14* (2006.01)
*B62J 50/22* (2020.01)

(52) U.S. Cl.
CPC ............. *B62J 50/225* (2020.02); *B62J 50/22* (2020.02); *H05K 7/1427* (2013.01)

(58) Field of Classification Search
CPC ........ B62J 50/225; B62J 50/22; H05K 7/1427
See application file for complete search history.

(56) References Cited

U.S. PATENT DOCUMENTS

| | | | |
|---|---|---|---|
| 10,647,381 B2 | 5/2020 | Durdevic | |
| 11,029,225 B1 * | 6/2021 | Tachibana | B62J 45/421 |
| 2014/0143785 A1 * | 5/2014 | Mistry | G06F 9/5044 |
| | | | 718/104 |
| 2018/0322376 A1 * | 11/2018 | Henry | G08C 17/02 |

FOREIGN PATENT DOCUMENTS

| | | |
|---|---|---|
| CN | 210364230 U | 4/2020 |
| CN | 212580052 U | 2/2021 |
| CN | 213199996 U | 5/2021 |
| EP | 3337720 A1 | 6/2018 |
| WO | 2021094324 A1 | 5/2021 |

OTHER PUBLICATIONS

European Search Report for EP-21000199.6, dated Jan. 12, 2022.
English abstract for CN-212580052.
English abstract for CN-213199996.
English abstract for CN-210364230.

* cited by examiner

*Primary Examiner* — Pete T Lee
(74) *Attorney, Agent, or Firm* — Fishman Stewart PLLC

(57) ABSTRACT

An operating device for a bicycle is disclosed. The operating device includes a display ring and a coaxially arranged operating ring arranged to rotate relative to the display ring. The display ring includes a display for displaying information and a first magnetic element that cooperates with a second magnetic element arranged on or in the operating ring. In a first position of the operating ring relative to the display ring, the first magnetic element is proximate to the second magnetic element, and if the operating ring is rotated away from the first position, the first magnetic element and the second element magnetically cooperate to bias the operating ring back to the first position. The display ring further includes a sensor that receives a signal when in proximity of a signal providing element.

20 Claims, 4 Drawing Sheets

OPERATING DEVICE FOR A BICYCLE

CROSS-REFERENCE TO RELATED APPLICATION

This application claims priority to European Application No. EP 21000199.6 filed on Jul. 23, 2021, the contents of which are hereby incorporated by reference in its entirety.

TECHNICAL FIELD

The invention relates to an operating device for a bicycle.

BACKGROUND

A known prior art operating device for a bicycle is disclosed in EP 3337720 A1. This shows in FIG. 2 a display unit 24 situated centrally on handlebar 22 and a remote control unit 26. Remote control unit 26 is situated in the region of a left handlebar lever 28 remote from display unit 24 and has two assistance selection keys 30, 32 for the selection of the motor assistance level, and an input device designed as a joystick 34 for menu navigation and selection of menu items displayed on display unit 24.

SUMMARY

The operating device has the advantage that, it combines the functions of displaying information and manually selecting operating parameters in a compact and ergonomic design.

This is achieved according to a first aspect of the invention with an operating device for a bicycle comprising a display ring and a coaxially arranged operating ring arranged to rotate relative to the display ring, whereby the display ring comprises a display for displaying information relevant to an operator and the display ring further comprising a first magnetic or ferromagnetic element which cooperates with a second magnetic or ferromagnetic element arranged on or in the operating ring, whereby in a first position of the operating ring relative to the display ring the first magnetic or ferromagnetic element is proximate to the second magnetic or ferromagnetic element, and if the operating ring is rotated away from the first position, the first magnetic or ferromagnetic element and the second magnetic or ferromagnetic element magnetically cooperated to bias the operating ring back to the first position, the display ring further comprising at least one sensor, which receives a signal when in proximity of a signal providing element provided in or on the operating ring, whereby the at least one sensor generates a signal for providing to a controller when the operating ring is rotated from the first position to a second position. The arrangement of the display together with the sensor and the first magnetic or ferromagnetic element in a single ring component has the advantage of enabling the operating device to have display and manual actuating functions in a compact, in particular narrow, design.

In a preferred embodiment, the display ring is arranged on an inner sleeve which is adapted for fixing to a handlebar of a bicycle, the inner sleeve comprising a flange arranged as a first axial bearing surface for the operating ring, and the display ring comprising an axially facing surface facing the flange and arranged as a second axial bearing surface for the operating ring. In this way the sleeve together with the operating ring and the display ring can be slid as a single unit over the handlebar and fixed in position.

In a preferred embodiment, the operating ring and the display ring are ring shaped, whereby one of the operating ring and the display ring is provided with an axially extending recess extending in the circumferential direction, and the other of the operating ring and the display ring is provided with a projection extending axially into the recess, whereby two generally circumferentially facing surfaces of the recess cooperate with two generally circumferentially facing surfaces of the projection to limit the maximum rotation angle of the operating ring. The operating ring can therefore be limited to rotate within a certain angle, so that the first magnetic or ferromagnetic element and the second magnetic or ferromagnetic element remain close enough to maintain a biasing force on the operating ring regardless of the rotational position of the operating ring with respect to the display ring. Advantageously the maxim rotation angle of the operating ring can be limited between 10 degrees to 45 degrees, so that the magnetic or ferromagnetic elements maintain a sufficient magnetic attraction to return the operating ring to a central position.

Advantageously the projection can be provided in the display ring and accommodates one of the first or second magnetic or ferromagnetic elements. The other of the first or second magnetic or ferromagnetic elements is arranged in the recess. By arranging one of the first or second magnetic or ferromagnetic elements in the projection, which is preferably arranged on the underside of a handlebar, fixing means e.g. a screw can be provided in the display ring axially adjacent to the projection to fix the display ring to a handlebar. In this way the screw and the projection can be hidden from an operator's view. The screw can advantageously be screwed through the display ring and the sleeve into a slot in the handlebar extending in the longitudinal direction in the underside of the handlebar. Advantageously, the magnetic or ferromagnetic element which is arranged in the recess is arranged in a position such that the operating ring can be rotated from a first equilibrium position in one direction to a second position, and from the first position in the opposite direction in a third position, whereby in the second and third positions the operating ring is biased towards the first equilibrium position. The operating device can therefore be used to shift up or down a gear, or to increase or decrease a motor assist level.

Advantageously the display of the operating device is formed by a plurality of LEDs mounted on a flexible circuit board which extends in the circumferential direction (12) on or in the display ring. In a further embodiment the sensor, which receives a signal when in proximity of a signal providing element provided in or on the operating ring, is also provided on the flexible circuit board. Preferably there are two such sensors arranged in the display ring to receive signals from two corresponding signal providing element provided in or on the operating ring. One of the two signal providing elements is arranged to be in proximity of one of the sensors in a second position of the operating ring, and the other of the two signal providing elements is arranged to be in proximity the other of the sensors in a third position of the operating ring, whereby the operating ring can be rotated from a first equilibrium position in one direction to a second position, and from the first position in the opposite direction in a third position, whereby in the second and third positions the operating ring is biased towards the first equilibrium position. In this embodiment, the LEDs can be advantageously positioned between the two sensors mounted on the flexible circuit board.

In a further embodiment of the operating device the operating ring is made from a transparent or semi-transparent material, and the display in the display ring is arranged radially inside the operating ring. By having a transparent or semi-transparent operating ring the display is visible through the material of the operating ring. In this way the operating device can be made with a particularly narrow design.

In alternative embodiment, the operating ring is made of a non-transparent material and comprises a window, and the display in the display ring is arranged radially inside the operating ring in the area of the window, such that the display is visible through the window. The use of a window in an otherwise non-transparent operating ring is particularly advantageous as the light from the display can be guided in the direction of the rider in order to limit light being emitted towards and distracting other traffic participants. The window may be made out of a solid transparent or semi-transparent material, or it can be in the form of an opening.

In a further embodiment the display ring can be formed of a plastic material and the display is overmolded by the plastic material of the display ring. Advantageously, the at least one sensor can also be overmolded by the plastic of the display. By overmolding the display and sensor components in the display ring, the components and their electrical contacts are protected from the elements and there is reduced risk of damage from vibrations.

In a further aspect of the invention, a bicycle or pedelec comprising a handlebar, a controller, and an operating device is provided, whereby the operating device is mounted on the handlebar, whereby the operating device comprises a display ring and a coaxially arranged operating ring arranged to rotate relative to the display ring, whereby the display ring comprises a display for displaying information relevant to an operator and the display ring further comprising a first magnetic or ferromagnetic element which cooperates with a second magnetic or ferromagnetic element arranged on or in the operating ring, whereby in a first position of the operating ring relative to the display ring the first magnetic or ferromagnetic element is proximate to the second magnetic or ferromagnetic element, and if the operating ring is rotated away from the first position, the first magnetic or ferromagnetic element and the second magnetic or ferromagnetic element magnetically cooperated to bias the operating ring back to the first position, the display ring further comprising at least one sensor, which receives a signal when in proximity of a signal providing element provided in or on the operating ring, whereby the at least one sensor generates a signal for providing to the controller when the operating ring is rotated from the first position to a second position, whereby the handlebar comprises a slot extending in the longitudinal direction of the handlebar, whereby the controller is connect to the operating device through a cable which extends through the slot, and the operating device is fixed to the handlebar by fixing means extending through the display ring and the slot. This arrangement enables an aesthetic connection of the display and operating signals to the controller via a cable which can be hidden from view of the rider.

In a further aspect of the invention, a bicycle or pedelec comprising a handlebar, a controller, and an operating device is provided, whereby the operating device is mounted on the handlebar, whereby the operating device comprises a display ring and a coaxially arranged operating ring arranged to rotate relative to the display ring, whereby the display ring comprises a display for displaying information relevant to an operator and the display ring further comprising a first magnetic or ferromagnetic element which cooperates with a second magnetic or ferromagnetic element arranged on or in the operating ring, whereby in a first position of the operating ring relative to the display ring the first magnetic or ferromagnetic element is proximate to the second magnetic or ferromagnetic element, and if the operating ring is rotated away from the first position, the first magnetic or ferromagnetic element and the second magnetic or ferromagnetic element magnetically cooperated to bias the operating ring back to the first position, the display ring further comprising at least one sensor, which receives a signal when in proximity of a signal providing element provided in or on the operating ring, whereby the at least one sensor generates a signal for providing to the controller when the operating ring is rotated from the first position to a second position, whereby the bicycle or pedelec further comprises a rear view sensor, for sensing the presence of traffic approaching from the rear, whereby the rear view sensor is connected wirelessly or wired to the controller, and the controller is connected by a cable to the operating device, whereby the display is arranged to indicate the presence of traffic approaching from the rear. It can be particularly advantageous to provide a bicycle or pedelec with two such operating devices arranged on the left and right side of the handlebar 3 respectively, in this case a rear view sensor can be used which differentiates traffic approaching from the rear left and rear right sides, whereby traffic approaching from the rear left is indicated on the display of the left operating device, and traffic approaching from the right is indicated on the display of the right operating device.

In a further embodiment the bicycle or pedelec is provided with at least one operating device according to any of the embodiments previously described, arranged on the left or right side of the handlebar, whereby when the operating ring is turned in a first direction, a gear ratio or a motor support level is changed, and whereby when the operating ring is rotated in the opposite direction an indicating signal is generated to alert other traffic participants of an intended turning direction. For example, an additional warning light may be arranged at the end of the handlebar on the left or the right side, which lights up when the operating ring is turned in said direction. Advantageously the bicycle or pedelec can be provided with two such operating devices on the left and right sides of the handlebar, so that one of the operating devices can shift up a gear ratio or increase a motor assistance level and the other operating device can shift down a gear ratio or decrease a motor assistance level when the operating ring is rotated in a first direction. When one of the operating rings is rotated in the opposite direction to the first direction, an indicating signal is generated for alerting traffic participants of an intended turning direction.

The term "bicycle" in this application means any pedal powered with two or three wheels. The term "pedelec" is a type of electric bicycle where the rider's pedalling is assisted by an electric motor.

BRIEF DESCRIPTION OF THE DRAWINGS

Embodiments will now be described by way of example only with reference to the accompanying drawings, in which.

DETAILED DESCRIPTION

Figure 1:
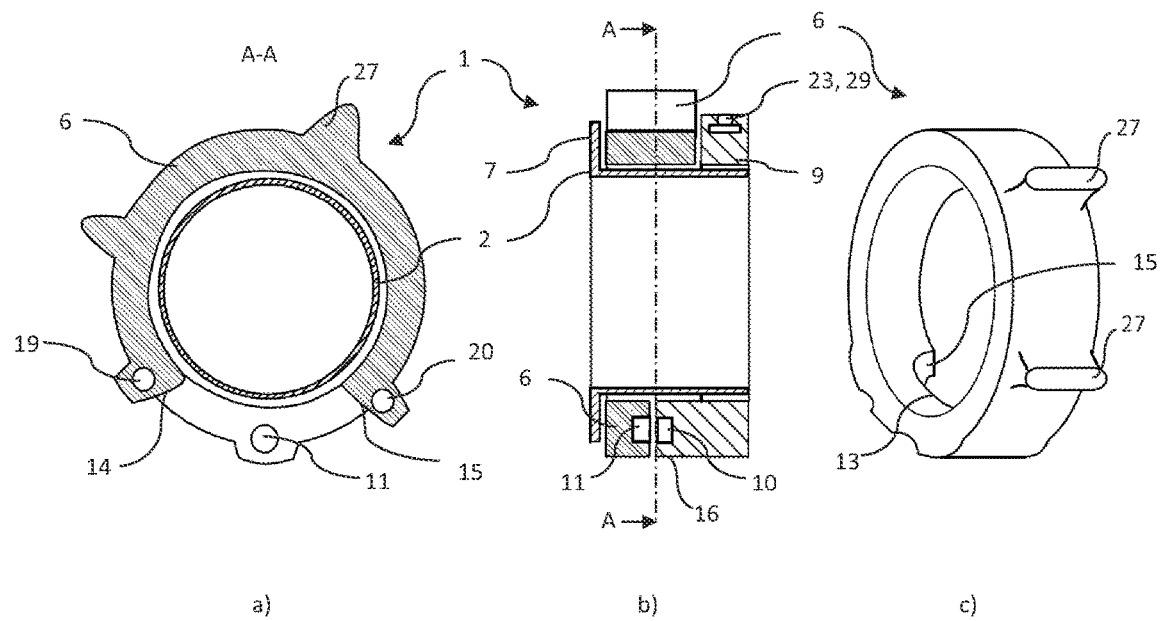
FIGS. 1a to 1c show two sections through an operating device according to a first embodiment of the invention.

Referring now to the figures, FIG. 1 shows a first embodiment of an operating device 1 according to the invention. FIG. 1a shows a section in the direction A-A through the operating device 1 in FIG. 1b. The operating device 1 is adapted to be attached to the handlebar of a bicycle. The operating device 1 enables the user to change at least one function relating to the bicycle. For example, the operating device 1 can send a signal to a controller to change an operating parameter of a bicycle. The operating parameter could be a e.g. gear ratio or, if used on an electric motor assisted bicycle, the operating device could be used to select the assistance level of the motor. The function could also be a display, whereby the operating device 1 can be operated to select which information is to be displayed.

Figure 5:
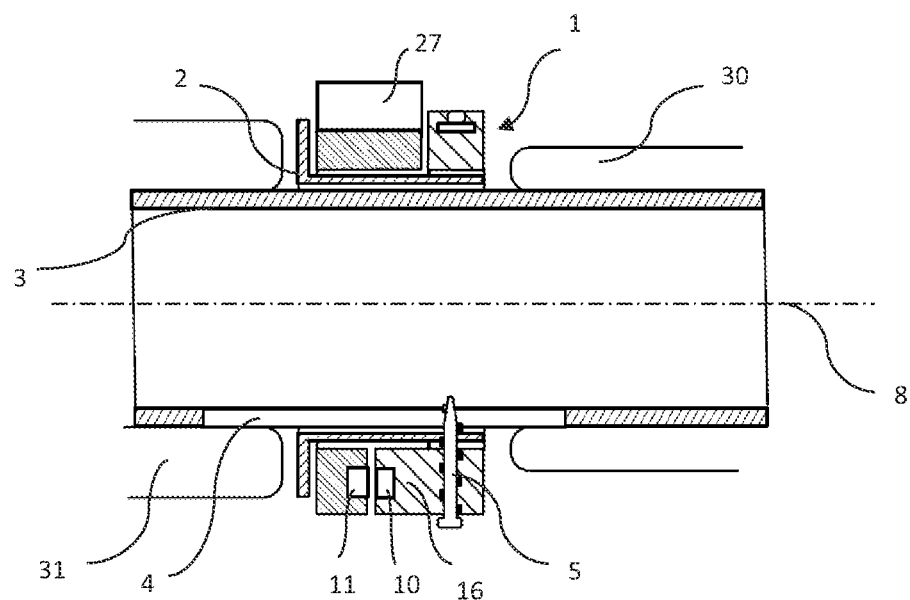
FIG. 5 shows a section through part of a handlebar including an operating device according to one embodiment of the invention.
Figure 6:
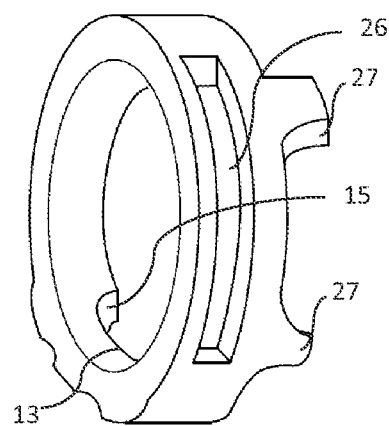
FIG. 6 shows a perspective view of an operating ring according to one embodiment of the invention.

Referring to FIG. 5 which shows a section through the operating device 1 on a section of a handlebar 3, the operating device comprises an inner sleeve 2 which is adapted to be attached to a handlebar 3 of a bicycle. For this purpose, the sleeve 2 can be provide with a hole so that the sleeve can be attached by a screw 5 to the handlebar 3. The handlebar 3 is preferably provided with a slot 4 on the lower side, the slot extending in the lengthwise direction of the handlebar, whereby the screw 5 for fixing the sleeve 2 can be screwed into the slot 4 at a desired position along the length of the handlebar 3.

Figure 7:
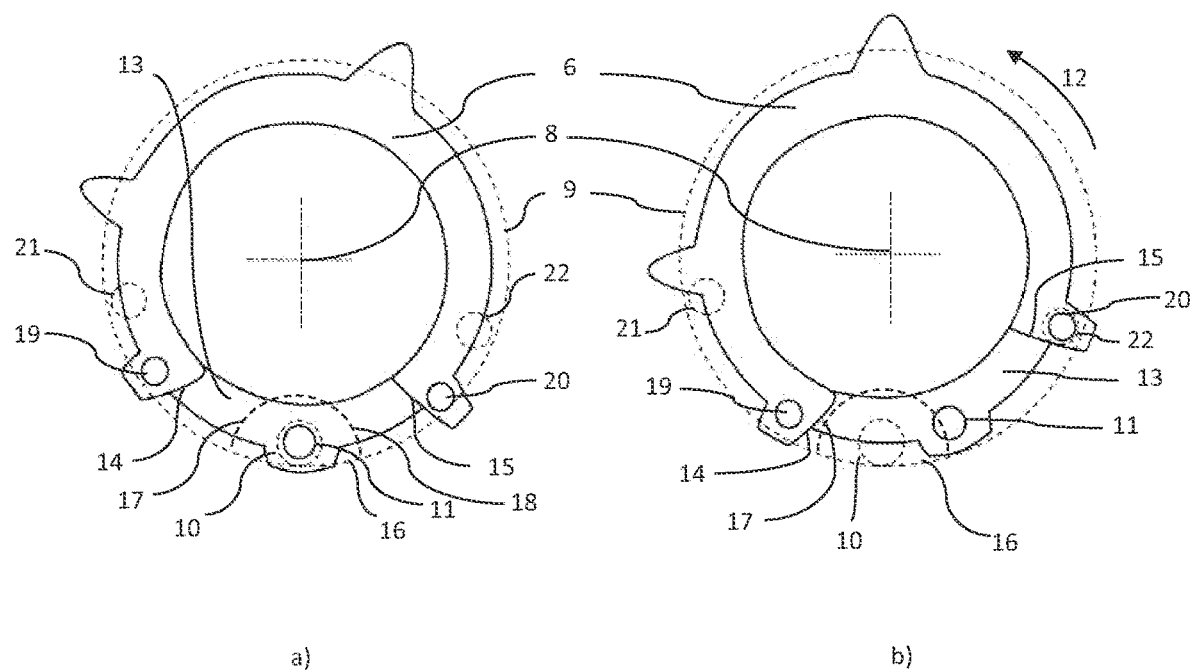
FIGS. 7a and 7b show a schematic section through the operating device in two different operating positions.

Referring to FIG. 1b, the sleeve 2 has a flange 7 at one axial end which acts as an axial limit stop for an operating ring 6, which is shown on its own in FIG. 1c. The operating ring 6 is arranged to rotate around a longitudinal axis 8 of the sleeve 2. A display ring 9 is arranged on the sleeve 2 adjacent to the operating ring 6 on the opposite side of the operating ring 6 to the flange 7 in order to act as second axial stop for the operating ring 6. The display ring 9 surrounds the sleeve 2 and can be fixed to the sleeve 2 by any suitable means. Advantageously the display ring 9 can be fixed by the screw 5 which penetrates through the sleeve into the slot 4 in the handlebar 3, so that the display ring 9 and sleeve 2 are fixed with one screw 5 to the handlebar 3. The operating ring 6 is therefore arranged between the flange 7 and the display ring 9, and arranged to rotate relative to the sleeve 2 and the display ring 9. The display ring 9 has the function of displaying information to a user and also the function of magnetically interacting with the operating ring 6 so that after the operating ring 6 has been manually rotated towards a second position, it subsequently returns automatically to a first position as depicted in FIG. 7. The first position is shown in FIG. 7a and a second position in shown in FIG. 7b. The dotted lines show the position of the stationary display ring 9 and the position of a magnetic or ferromagnetic element 10 which is attached to the display ring 9. In the first position in FIG. 7a the magnetic or ferromagnetic element 10 is axially facing a magnetic or ferromagnetic element 11 which is arranged in the operating ring 6 and the magnetic or ferromagnetic element 10 is magnetically attracted to the corresponding magnetic or ferromagnetic element 11. When the operating ring is manually rotated in a first direction 12 towards a second position shown in FIG. 7b, the magnetic or ferromagnetic element 11 in the operating ring 6 moves away from the magnetic or ferromagnetic element 10 in the display ring 9, the attraction force between the two elements however act to move the operating ring 6 back to the first position in FIG. 7a.

The operating ring 6 is free to move from the first position in FIG. 7a where the magnetic or ferromagnetic element 10 is axially facing the corresponding magnetic or ferromagnetic element 11 in either a clockwise or anticlockwise direction between two limits defined by cooperating limit stops in both the operating ring 6 and the display ring 9. For this purpose the operating ring 6 can be provided with a recess 13 having first and second stop surfaces 14, 15 facing generally in the circumferential direction. The display ring 9 has a projection 16 which extends in the axial direction 8 into the recess 13 and having stop surfaces 17, 18 facing generally in the circumferential direction. The magnetic or ferromagnetic element 10 in the display ring 9 is arranged in the projection 16 so that there is only a small axial gap between the magnetic or ferromagnetic element 10 and the magnetic or ferromagnetic element 11 in the operating ring 6 in the first position. FIG. 7b shows the position of the operating ring 6 in a second position whereby the stop surface 14 of the recess 13 and the stop surface 17 of the projection 16 are contacting each other. In this position the magnetic or ferromagnetic element 10 is not directly facing the magnetic or ferromagnetic element 11 in the operating ring 6, but due to the position of the stop surfaces 14 and 17, the operating ring 6 is magnetically biased towards the first position. The maximum rotation of the operating ring 6 is therefore preferably limited to between 10 degrees to 45 degrees, so that the magnetic or ferromagnetic elements 10 and 11 maintain a sufficient magnetic attraction to return the operating ring 6 to the central position in FIG. 7a. It should be noted that the recess 13 with first and second stop surfaces 14, 15 could alternatively be provided in the display ring 9 and the projection 16 having stop surfaces 17, 18 could be provided in the operating ring 6.

Figure 3:
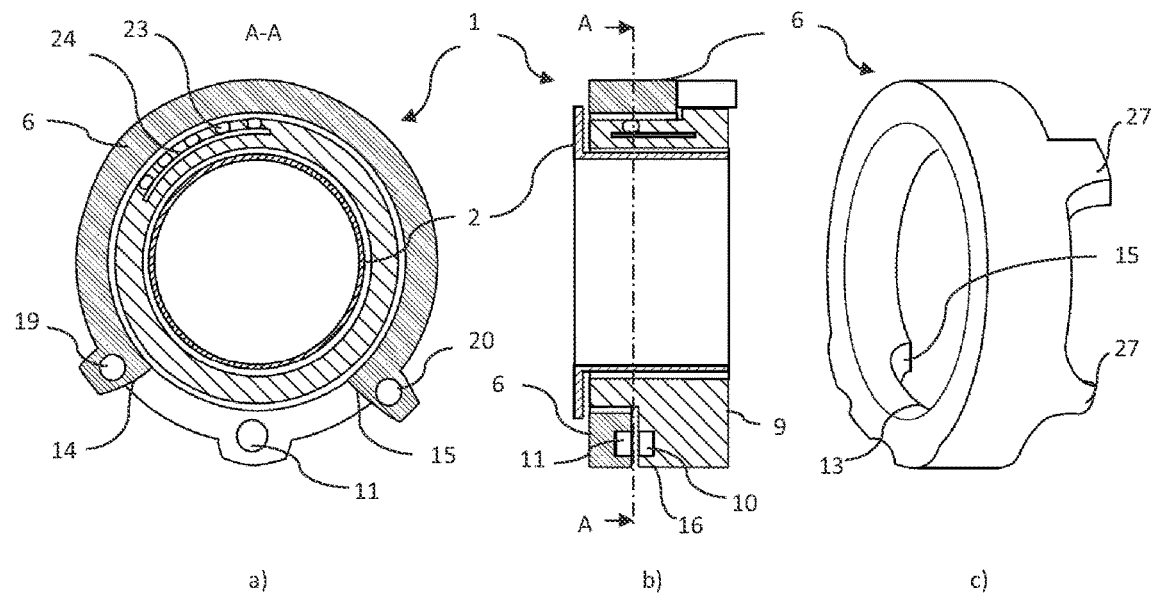
FIGS. 3a to 3c show two sections through an operating device according to a further embodiment of the invention.

In the embodiments shown in figures the operating ring 6 further comprises first and second signal providing elements 19, 20. These are preferably in the form of magnets 19, 20, but they could also be metallic elements which can cause a change in a sensing element. The display ring 9 is provided with a first sensor 21 and a second sensor 22. In the first position in FIG. 7a the first and second signal providing elements 19, 20 are located in a circumferential position on the operating ring 6, which are not proximal the first sensor 21 or the second sensor 22. When the operating ring is rotated into the second position in FIG. 7b, where the stop 17 on the operating ring 6 is contacting the stop 17 on the display ring 9, the signal providing element 20 is proximal to the sensor 22 on the display ring 9. In FIG. 3 it can be seen that the signal providing element 20 axially opposes the sensor 22 in this position. In an alternative embodiment in FIG. 4 the signal providing element 20 radially opposes the sensor 22 in this position. The sensors 21 and 22 on the display ring provide signals to a controller when a is in proximity to one of the sensors 21, 22 in order to change an operating parameter of a bicycle. For example for changing to a higher or lower gear. In one embodiment the if the signal providing element 19, 20 operating ring 6 is rotated in a first direction a gear is shifted down and, if rotated in the opposite direction, a gear is shifted up. Alternatively the operating ring 6 can be used to change the motor assist level on a motor assisted bicycle i.e. a pedelec. The signal providing elements 19, 20 are provided in the operating ring 6 adjacent the recess 13.

Referring back to FIG. 1, in this embodiment of the operating device 1 the display ring 9 additionally comprises a display 23. The display 23 is arranged to one side of the operating ring 6 in the axial direction 8. The display 23 is comprised of Light Emitting Diodes (LEDs) 29 surface mounted on a flexible circuit board 24. The surface mounted LEDs 29 are preferably coated with a water resistant coating. The display 23 can be overmolded by the material of the display ring, which is preferably a plastic material, so that the LEDs 29 are visible, but the flexible circuit board 24 and the electrical connections are fixed and protected from water and vibrations. The LEDs 29 are preferably addressable LEDs, so that the display 23 can be used to display various information relevant to the rider of the bicycle. The fact that the display 23 is integrated into the same part 9 as the magnetic or ferromagnetic element 10 and the sensors 21 and 22 enables the functions of an operating device and display to be arranged in a space saving manner on the handlebar, in particular between the grip 30 of a handle bar and a brake lever attachment 31. The signals provided by the sensors 21, 22 are connected by a cable (not shown) to a controller. This cable can be also carry the control signal and power for the display, so that there is only one cable exiting the display ring 9 which can be connected to a connector (not shown) in the bicycle handlebar 3 via the slot 4 in the handlebar 3.

Figure 2:
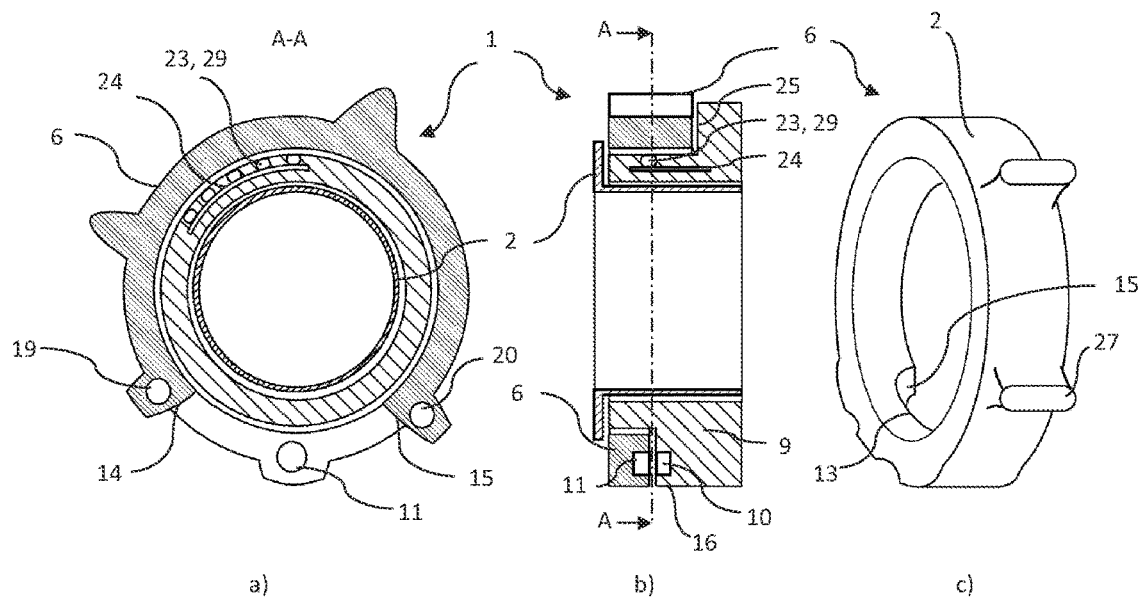
FIGS. 2a to 2c show two sections through an operating device according to a further embodiment of the invention.
Figure 4:
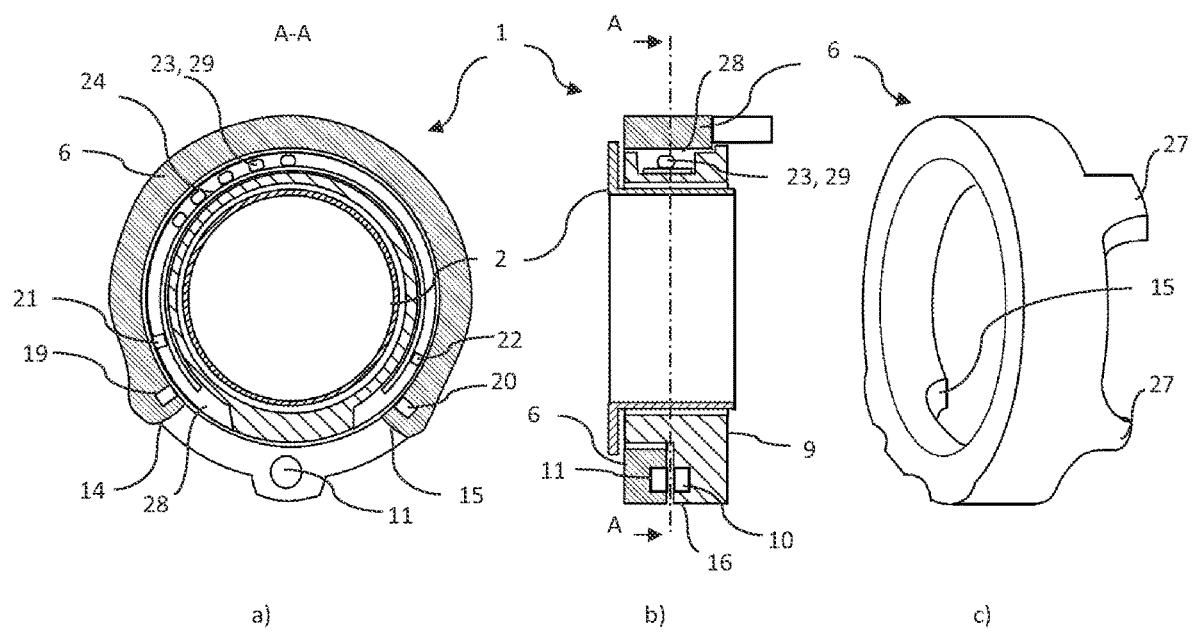
FIGS. 4a to 4c shows two sections through an operating device according to a further embodiment of the invention.

Referring to FIG. 2 to 4 which show further embodiments of the operating device 1. In these embodiments the display 23 is arranged in or on the display ring 9 radially inside the operating ring 6. The operating ring 6 is made from a transparent or semi-transparent material, preferably a plastic material. The display 23 is therefore visible through the material of the operating ring 6. In this way the operating device 1 can be made with a particularly narrow design. In these embodiments the display ring 9 extends in the axial direction 8 between the inner sleeve 2 and the operating ring 6 and comprises a radially extending surface 25 which faces the operating ring 6 and acts as an axial bearing surface for the operating ring 6.

Instead of the operating ring 6 being made out of uniform material, it could also be made of a non-transparent material and comprising a window 26 in the area of the display 23. The window 26 can either be in the form of an opening or it can be made of a transparent or semi-transparent material. The operating ring 6 can be formed by overmolding the transparent or semi-transparent window material. It should be noted that the window must extend far enough in the circumferential direction such that the display is visible regardless of the position of the operating ring 6 between the stop positions defined by the stop surfaces 14, 15, 17, 18. In order to aid manual operating of the operating ring 6, the ring can comprises one or more radially extending tabs 27. The one or more tabs can alternatively extend in the axial direction as shown in FIGS. 3 and 4. In this way the tabs 27 do not interfere with viewing the display 23 located radially inside the operating ring 6, and the tabs can be more easily operated e.g. by thumb or index finger. The use of a window 26 in an otherwise non-transparent operating ring 6 is particularly advantageous as the light from the display 23 can be guided in the direction of the rider in order to limit light being emitted towards and distracting other traffic participants.

A particularly advantageous embodiment is shown in FIG. 4 whereby the sensors 21 and 22 are provided as surface mounted devices on the flexible circuit board 24 together with the surface mounted LEDs 29. The surface mounted LEDs 29 being arranged between the first sensor 21 and the second sensor 22. The flexible circuit board 23 with the surface mounted LEDs 29 and the sensors 21 and 22 may be accommodated in a recess 28 in the display ring 9 which extends at least partially in the circumferential direction. In this embodiment the sensors 21 and 22 are located radially inwards of the signal providing elements 19 and 20, so that when the operating ring 6 is rotated in the anticlockwise direction 12 the signal providing element 20 is moved into a position radially facing the sensor 22, and if the operating ring 6 is rotated in the clockwise direction the signal providing element 19 is moved into a position radially facing the sensor 21. As the sensors 21, 22 and the LEDs 29 are mounted on the same flexible circuit board 24 only a single cable needs to be connected to the flexible circuit board 24 providing power to the LEDs 29 and carrying signals from the sensors 21, 22 and control signals for the LEDs 29. As shown in FIG. 4b the operating ring 6 bears radially on a radially outer surface of the display ring 9, and the display 23 is arranged in the recess 28 so that it does not come into contact with the operating ring 6. The display 23 can be fixed in position by any suitable means. Advantageously the display 29 is fixed in position by overmolding such that the LEDs 29 are visible through the surface of the overmold. The display ring 9 could alternatively be made by overmolding the flexible circuit board 24 with the display 23 and the sensors 21, 22 such that the LEDs are visible at the surface of the display ring 9, however the outer surface of the LEDs 29 are positioned radially inwards of the radial bearing surface of the display ring 9 so that the operating ring 6 does not contact the LEDs 29 directly.

The drawings show five LEDs 29, however any suitable number of LEDs 29 can be used to display the necessary information to the rider.

A bicycle or pedelec can be provided with an operating device 1 according to any of the described embodiments arranged on a handlebar 3. The bicycle may be provided with a rear view sensor for sensing traffic approaching from behind. The display 23 can indicate the proximity of the traffic approaching from behind. In particular the number of LEDs 29 that light up or their colour can indicate the proximity of rear traffic participants. It can be particularly advantageous to provide a bicycle or pedelec with two such operating devices 1 arranged on the left and right side of the handlebar 3 respectively. In this case, a rear view sensor can also be arranged on the pedelec or bicycle which can sense the proximity of traffic approaching from the rear, and also differentiate between traffic approaching from the rear left and right sides. The rear view sensor can operate by radar or lidar as is known in the art. The rear view sensor can be connected wirelessly or wired to a controller which is also connected to the left and right operating devices 1, so that traffic approaching from the left from behind is indicated on the left operating device 1 and traffic approaching from the right from behind is indicated on the right operating device 1.

In a further embodiment a bicycle or pedelec can be provided with at least one operating device 1 according to any of the embodiments described with respect to the figures, arranged on the left or right side of the handlebar 3, whereby when the operating ring 6 is turned in a first direction, a gear ratio or a motor support level is changed, and whereby when the operating ring 6 is rotated in the opposite direction an indicating signal is generated to alert other traffic participants of an intended turning direction. For example, an additional warning light may be arranged at the end of the handlebar 3 on the left or the right side, which lights up when the operating ring 6 is turned in said direction. Preferably the bicycle or pedelec is provided with two such operating devices 1 on the left and right sides of the handlebar 3, so that one of the operating devices 1 can shift up a gear ratio or increase a motor assistance level and the other operating device 2 can shift down a gear ratio or decrease a motor assistance level when the operating ring 6 is rotated in a first direction. When one of the operating rings 6 is rotated in the opposite direction to the first direction, an indicating signal is generated for alerting traffic participants of an intended turning direction.

The invention claimed is:

1. An operating device for a bicycle, comprising:
a display ring and a coaxially arranged operating ring arranged to rotate relative to the display ring, the display ring including a display for displaying information relevant to an operator and the display ring further including a first magnetic or ferromagnetic element that cooperates with a second magnetic or ferromagnetic element arranged on or in the operating ring, wherein in a first position of the operating ring relative to the display ring the first magnetic or ferromagnetic element is proximate to the second magnetic or ferromagnetic element, and if the operating ring is rotated away from the first position, the first magnetic or ferromagnetic element and the second magnetic or ferromagnetic element magnetically cooperated to bias the operating ring back to the first position,
the display ring further including at least one sensor that receives a signal when in proximity of a signal providing element provided in or on the operating ring, wherein the at least one sensor generates a signal for providing to a controller when the operating ring is rotated from the first position to a second position.

2. The operating device according to claim 1, wherein the display ring is arranged on an inner sleeve structured and arranged for fixing to a handlebar, the inner sleeve including a flange arranged as a first axial bearing surface for the operating ring, and the display ring further includes an axially facing surface facing the flange and arranged as a second axial bearing surface for the operating ring.

3. The operating device according to claim 1, wherein the operating ring and the display ring are ring shaped, wherein one of the operating ring and the display ring is provided with an axially extending recess extending in L circumferential direction, and the other of the operating ring and the display ring is provided with a projection extending axially into the recess, and wherein two circumferentially facing surfaces of the recess cooperate with two circumferentially facing surfaces of the projection to limit a maximum rotation angle of the operating ring.

4. The operating device according to claim 3, wherein the projection is provided in the display ring and accommodates one of the first magnetic or ferromagnetic element or the second magnetic or ferromagnetic element.

5. The operating device according to claim 1, wherein the display includes a plurality of LEDs mounted on a flexible circuit board that extends in a circumferential direction on or in the display ring.

6. The operating device according to claim 5, wherein the at least one sensor is mounted on the flexible circuit board.

7. The operating device according to claim 1, wherein the operating ring is composed of a transparent or semi-transparent material, and the display in the display ring is arranged radially inside the operating ring.

8. The operating device according to claim 1, wherein the operating ring is composed of a non-transparent material and comprises a window, and the display in the display ring is arranged radially inside the operating ring in an area of the window, such that the display is visible through the window.

9. The operating device according to claim 1, wherein the display ring is composed of a plastic material and the display is overmolded by the plastic material of the display ring.

10. The operating device according to claim 9, wherein the at least one sensor is overmolded by the plastic material of the display.

11. A bicycle or pedelec, comprising:
a handlebar, a controller, and an operating device mounted on the handlebar,
the operating device including a display ring and a coaxially arranged operating ring arranged to rotate relative to the display ring, the display ring including a display for displaying information relevant to an operator and the display ring further including a first magnetic or ferromagnetic element that cooperates with a second magnetic or ferromagnetic element arranged on or in the operating ring, wherein in a first position of the operating ring relative to the display ring the first magnetic or ferromagnetic element is proximate to the second magnetic or ferromagnetic element, and when the operating ring is rotated away from the first position, the first magnetic or ferromagnetic element and the second magnetic or ferromagnetic element magnetically cooperate to bias the operating ring back to the first position,
the display ring further including at least one sensor that receives a signal when in proximity of a signal providing element provided in or on the operating ring, wherein the at least one sensor generates a signal for providing to the controller when the operating ring is rotated from the first position to a second position,
wherein the handlebar comprises a slot extending in a longitudinal direction of the handlebar, wherein the controller is connected to the operating device through a cable that extends through the slot, and the operating device is fixed to the handlebar by a fixing mechanism extending through the display ring and the slot.

12. A bicycle or pedelec, comprising:
a handlebar, a controller, an operating device mounted on the handlebar, and a rear view sensor for sensing the presence of traffic approaching from the rear,
the operating device including a display ring and a coaxially arranged operating ring arranged to rotate relative to the display ring, the display ring including a display for displaying information relevant to an operator and the display ring further including a first magnetic or ferromagnetic element that cooperates with a second magnetic or ferromagnetic element arranged on or in the operating ring, wherein in a first position of the operating ring relative to the display ring the first magnetic or ferromagnetic element is proximate to the second magnetic or ferromagnetic element, and when the operating ring is rotated away from the first position, the first magnetic or ferromagnetic element and the second magnetic or ferromagnetic element magnetically cooperate to bias the operating ring back to the first position,
the display ring further including at least one sensor that receives a signal when in proximity of a signal providing element provided in or on the operating ring, wherein the at least one sensor generates a signal for providing to the controller when the operating ring is rotated from the first position to a second position,
wherein the rear view sensor is connected wirelessly or wired to the controller, and the controller is connected by a cable to the operating device, wherein the display is arranged to indicate the presence of traffic approaching from the rear that is sensed by the rear view sensor.

13. The bicycle or pedelec according to claim 12, wherein the operating device further includes an inner sleeve fixed to the handlebar and the display ring is arranged on the inner sleeve, the inner sleeve including a flange arranged as a first axial bearing surface for the operating ring;

wherein the display ring further includes an axially facing surface that faces the flange and is arranged as a second axial bearing surface for the operating ring.

14. The bicycle or pedelec according to claim 12, wherein one of the operating ring and the display ring is provided with an axially extending recess extending in a circumferential direction, and the other of the operating ring and the display ring is provided with a projection extending axially into the recess, and wherein two circumferentially facing surfaces of the recess cooperate with two circumferentially facing surfaces of the projection to limit a maximum rotation angle of the operating ring.

15. The bicycle or pedelec according to claim 14, wherein the projection is provided in the display ring and accommodates one of the first magnetic or ferromagnetic element and the second magnetic or ferromagnetic element, and the other of the first magnetic or ferromagnetic element and the second magnetic or ferromagnetic element is arranged in the recess.

16. The bicycle or pedelec according to claim 11, wherein the operating device further includes an inner sleeve fixed to the handlebar and the display ring is arranged on the inner sleeve, the inner sleeve including a flange arranged as a first axial bearing surface for the operating ring;

wherein the display ring further includes an axially facing surface that faces the flange and is arranged as a second axial bearing surface for the operating ring.

17. The bicycle or pedelec according to claim 11, wherein one of the operating ring and the display ring is provided with an axially extending recess extending in a circumferential direction, and the other of the operating ring and the display ring is provided with a projection extending axially into the recess, and wherein two circumferentially facing surfaces of the recess cooperate with two circumferentially facing surfaces of the projection to limit a maximum rotation angle of the operating ring.

18. The bicycle or pedelec according to claim 17, wherein the projection is provided in the display ring and accommodates one of the first magnetic or ferromagnetic element and the second magnetic or ferromagnetic element, and the other of the first magnetic or ferromagnetic element and the second magnetic or ferromagnetic element is arranged in the recess.

19. The bicycle or pedelec according to claim 11, wherein the display includes a plurality of LEDs mounted on a flexible circuit board that extends in a circumferential direction on or in the display ring.

20. The bicycle or pedelec according to claim 11, wherein the operating ring is composed of a transparent or semi-transparent material, and the display in the display ring is arranged radially inside the operating ring.

* * * * *

UNITED STATES PATENT AND TRADEMARK OFFICE
CERTIFICATE OF CORRECTION

| | |
|---|---|
| PATENT NO. | : 11,608,135 B2 |
| APPLICATION NO. | : 17/868760 |
| DATED | : March 21, 2023 |
| INVENTOR(S) | : Thomas Roberts |

It is certified that error appears in the above-identified patent and that said Letters Patent is hereby corrected as shown below:

In the Claims

At Column 9, Claim number 3, Line number 44, please remove "L" and replace with the word a.

Signed and Sealed this
First Day of August, 2023

Katherine Kelly Vidal
*Director of the United States Patent and Trademark Office*